United States Patent
Lee et al.

(10) Patent No.: US 11,719,379 B2
(45) Date of Patent: Aug. 8, 2023

(54) POSITION ADJUSTMENT DEVICE FOR DISPLAY MODULE AND DISPLAY DEVICE HAVING THE SAME

(71) Applicant: SAMSUNG DISPLAY CO., LTD., Yongin-si (KR)

(72) Inventors: Jee-Na Lee, Anyang-si (KR); Junhee Son, Asan-si (KR); Mansoo Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 38 days.

(21) Appl. No.: 17/463,460

(22) Filed: Aug. 31, 2021

(65) Prior Publication Data
US 2022/0120373 A1    Apr. 21, 2022

(30) Foreign Application Priority Data
Oct. 20, 2020 (KR) .................. 10-2020-0135928

(51) Int. Cl.
*H05K 5/00* (2006.01)
*F16M 11/04* (2006.01)

(52) U.S. Cl.
CPC ......... *F16M 11/043* (2013.01); *H05K 5/0021* (2013.01)

(58) Field of Classification Search
USPC ........................................ 361/728, 755, 807
See application file for complete search history.

(56) References Cited

U.S. PATENT DOCUMENTS

| 2005/0134525 | A1  | 6/2005 | Tanghe et al. |
| 2018/0124932 | A1* | 5/2018 | Seo .................. H05K 5/0017 |
| 2020/0103068 | A1* | 4/2020 | Ahn ................... F16M 13/02 |
| 2020/0205305 | A1* | 6/2020 | Kim .................. F16M 11/041 |
| 2022/0022330 | A1* | 1/2022 | Dewaele ............ F16M 11/18 |

FOREIGN PATENT DOCUMENTS

| KR | 10-2005-0065396 | 6/2005 |
| KR | 10-2020026      | 9/2019 |
| KR | 10-2020-0076384 | 6/2020 |

* cited by examiner

*Primary Examiner* — Hung S. Bui
(74) *Attorney, Agent, or Firm* — Lewis Roca Rothgerber, Christie LLP

(57) ABSTRACT

A position adjustment device for a display module and a display device including the same are provided. A position adjustment device for a display module includes: a first direction control module including a first stage to which a display module is fixable, the first stage being movable in a first direction; a second direction control module coupled to the first direction control module and including a second stage movable in a second direction perpendicular to the first direction, and a first controller coupled to the second stage; and a third direction control module coupled to the second direction control module and including a third stage movable in a third direction perpendicular to the first direction and crossing the second direction, and a second controller coupled to the third stage.

20 Claims, 14 Drawing Sheets

310: 312, 313
320: 321, 322, 323

DR3
DR2

210: 213, 314
220: 221, 222, 223

POSITION ADJUSTMENT DEVICE FOR DISPLAY MODULE AND DISPLAY DEVICE HAVING THE SAME

CROSS-REFERENCE TO RELATED APPLICATION

This application claims priority to and the benefit of Korean Patent Application No. 10-2020-0135928, filed on Oct. 20, 2020 in the Korean Intellectual Property Office, the entire content of which is hereby incorporated by reference.

BACKGROUND

1. Field

Aspects of embodiments of the present disclosure relate to a position adjustment device for a display module and a display device including the same.

2. Description of the Related Art

When a display device is installed in a public place or a public facility that is open and accessible to many people, a large display device may be required due to the nature of the place where it is installed. A multi-display device includes a plurality of unit displays, and the multi-display device may effectively provide image information to a crowd of people in a public place since the multi-display device is driven as if images are displayed in a single screen. Meanwhile, the multi-display device is implemented by aligning a plurality of display modules in a tile arrangement. Then, in an aspect of image quality control, it is important to ensure that the screens of adjacent unit displays are naturally combined to be perceived as if the images are displayed in one screen.

SUMMARY

According to an aspect of embodiments of the present disclosure, a position adjustment device for a display module to align a plurality of display modules with each other and a display device including the position adjustment device for the display module are provided.

According to another aspect of embodiments of the present disclosure, a position adjustment device capable of precisely aligning display modules of unit display devices in a tiled display device having a high resolution is provided.

According to another aspect of embodiments of the present disclosure, unit display devices including a position adjustment device for a display module to provide a tiled display device in which the unit display devices are precisely aligned is provided.

According to one or more embodiments of the present disclosure, a display module position adjustment device includes: a first direction control module including a first stage to which a display module is fixable, the first stage being movable in a first direction; a second direction control module coupled to the first direction control module and including a second stage movable in a second direction perpendicular (perpendicular or substantially perpendicular) to the first direction, and a first controller coupled to the second stage; and a third direction control module coupled to the second direction control module and including a third stage movable in a third direction perpendicular (perpendicular or substantially perpendicular) to the first direction and crossing the second direction and a second controller coupled to the third stage.

In one or more embodiments, the first direction control module further includes a coupling screw protruding from a first surface of the first stage to the second stage and including a plurality of first thread crests.

In one or more embodiments, the first stage includes a second surface opposite to the first surface and including a fixing groove to which the display module is fixable.

In one or more embodiments, the first stage includes a third surface connecting the first surface and the second surface and including a plurality of concave-convex portions defined therein.

In one or more embodiments, the second stage includes a first coupling hole in which a plurality of first thread roots coupled to the first thread crests is defined and a second coupling hole to which the first controller is coupled.

In one or more embodiments, the first controller includes a first portion coupled to the second coupling hole, a second portion coupled to the third stage, and a third portion exposed to an outside to be operated by a user.

In one or more embodiments, the first portion has a spherical shape.

In one or more embodiments, the second portion includes a plurality of second thread crests, the third stage includes a through hole in which a plurality of second thread roots is defined, and the second thread crests are coupled to the second thread roots.

In one or more embodiments, the third portion includes an adjustment groove to which an adjustment tool to rotate the first controller is engageable.

In one or more embodiments, the third stage includes a first contact portion making contact with the second controller and a through hole to which the first controller is coupled.

In one or more embodiments, the second controller includes a second contact portion making contact with the third stage, a control portion exposed to an outside to be operated by a user, and a connection portion connecting the second contact portion and the control portion.

In one or more embodiments, the control portion includes an adjustment groove to which an external adjustment tool is engageable.

In one or more embodiments, the first contact portion includes a plurality of thread roots, and the second contact portion includes a plurality of thread crests.

In one or more embodiments, the coupling screw of the first stage is rotatably coupled to the second stage, and the first stage is rotatable by rotation of the coupling screw to move in the first direction.

In one or more embodiments, the first controller is rotatably coupled to the second stage, and the second stage is movable in the second direction by rotation of the first controller.

In one or more embodiments, the second controller is rotatably coupled to the third stage, and the third stage is movable in the third direction by rotation of the second controller.

In one or more embodiments, the first controller is arranged in a same direction as the second controller.

In one or more embodiments, the position adjustment device further includes a first case between the first direction control module and the second direction control module, a second case coupled to the first case and arranged between the second direction control module and the third direction control module, and a third case coupled to the second case and arranged under the third direction control module.

According to one or more embodiments of the present disclosure, a display device includes: a display module configured to display an image to a front side, a cabinet to which the display module is fixed, an assembly member on a rear surface of the display module, and a display module position adjustment device coupled to the assembly member and fixed inside the cabinet. The display module position adjustment device includes: a first direction control module coupled to the assembly member and including a first stage movable in a first direction; a second direction control module coupled to the first direction control module and including a second stage movable in a second direction perpendicular (perpendicular or substantially perpendicular) to the first direction, and a first controller coupled to the second stage; and a third direction control module coupled to the second direction control module and including a third stage movable in a third direction perpendicular (perpendicular or substantially perpendicular) to the first direction and crossing the second direction, and a second controller coupled to the third stage.

In one or more embodiments, the cabinet includes an opening through which portions of the first and second controllers of the display module position adjustment device are exposed.

According to an aspect of embodiments of the present disclosure, the display module position adjustment device is coupled to each unit display device included in the tiled display device and aligns the display modules with each other. When the display modules disposed adjacent to each other are precisely aligned, a display quality of the tiled display device is improved.

BRIEF DESCRIPTION OF THE DRAWINGS

The above and other aspects and advantages of the present disclosure will become readily apparent by reference to the following detailed description when considered in conjunction with the accompanying drawings, wherein.

DETAILED DESCRIPTION

Figure 1:
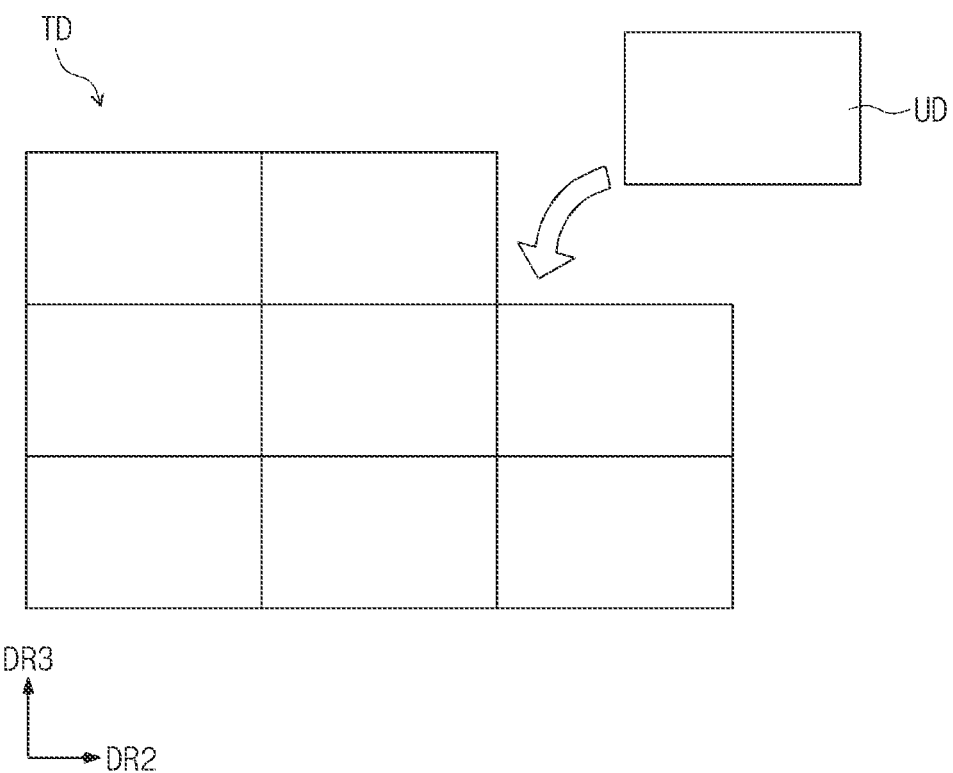
FIG. 1 is a plan view showing a tiled display device including a display device according to an embodiment of the present disclosure.

In the present disclosure, it is to be understood that when an element or layer is referred to as being "on," "connected to," or "coupled to" another element or layer, it may be directly on, connected, or coupled to the other element or layer, or one or more intervening elements or layers may be present.

Like reference numerals refer to like elements throughout. In the drawings, the thickness, ratio, and dimensions of components may be exaggerated for purposes of description of the technical content. As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element's or feature's relationship to another element(s) or feature(s) as shown in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

It is to be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and are not be interpreted in an idealized or overly formal sense unless expressly so defined herein.

Herein, some example embodiments of the present disclosure will be described with reference to accompanying drawings.

FIG. 1 is a plan view showing a tiled display device including a display device according to an embodiment of the present disclosure.

Referring to FIG. 1, a tiled display device TD may include a plurality of unit display devices UD. The tiled display device TD may be a large-sized display device in which the unit display devices UD are arranged adjacent to each other, such as tiles. For example, the tiled display device TD may include the unit display devices UD arranged in a matrix of four rows by four columns. For example, when each of the unit display devices has a screen size of about 36.5 inches in a diagonal line, the tiled display device may have a screen size of about 146 inches in a diagonal line. However, embodiments of the present disclosure are not limited to any particular number or size of the unit display devices UD.

A display quality of the screen of the tiled display device TD may be determined according to the arrangement of the unit display devices UD adjacent to each other. A precise alignment technology for the unit display devices UD adjacent to each other is required to realize a natural image on the screen of the tiled display device TD. The display device according to one or more embodiments of the present disclosure may include a position adjustment device for a display module (herein, referred to as a display module position adjustment device) to precisely adjust the position of the display module and may be aligned with another display device adjacent thereto. In the present disclosure, "display device" is used in the same meaning as "unit display device."

Figure 2:
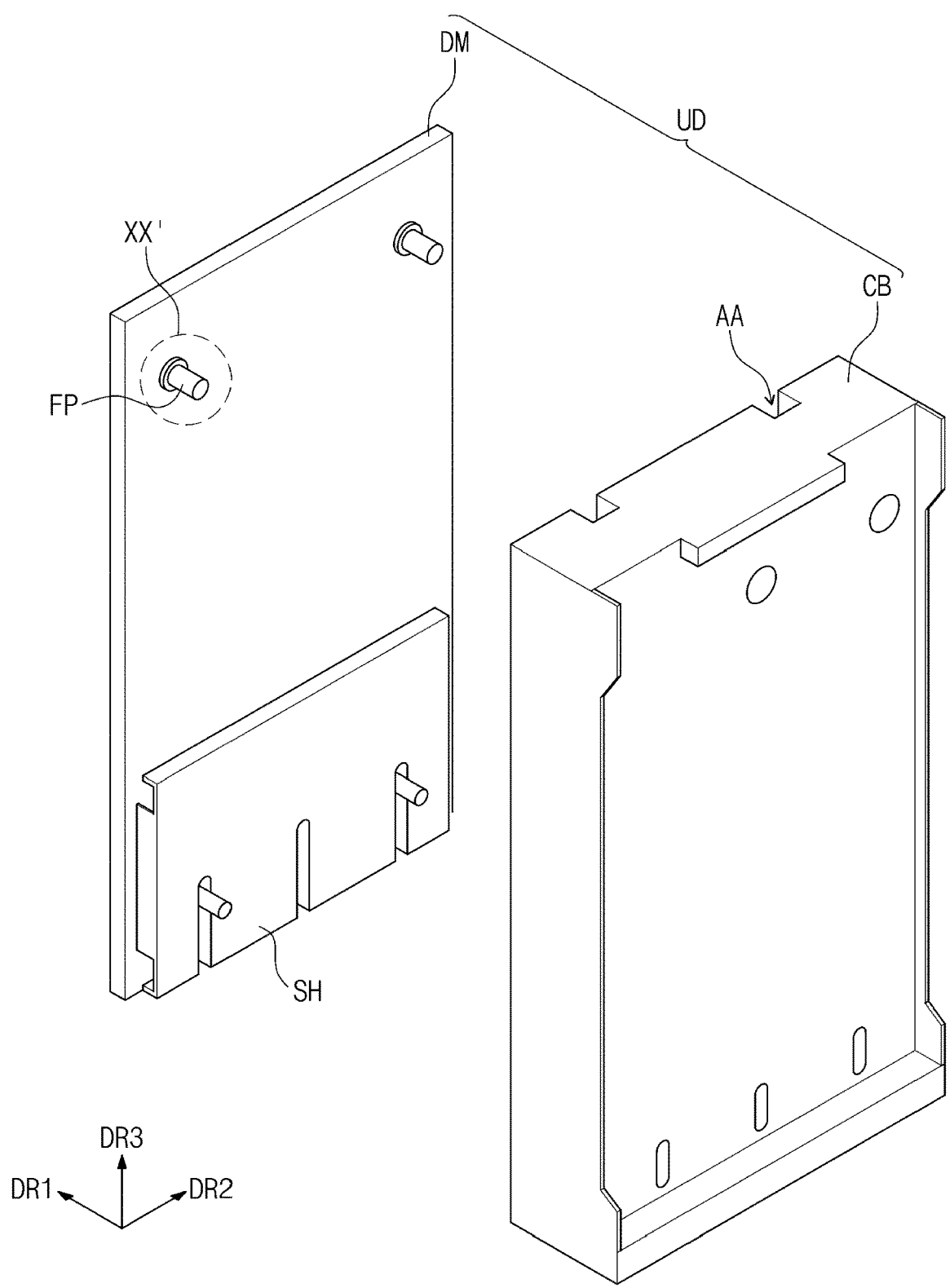
FIG. 2 is an exploded perspective view showing a display device according to an embodiment of the present disclosure.

FIG. 2 is an exploded perspective view showing a display device according to an embodiment of the present disclosure. The display device UD of the present disclosure may include a display module DM. Although not shown in detail, the display module DM may include a display panel, an input sensor, and a cover panel.

The display device UD according to an embodiment may correspond to one unit display device UD forming the tiled display device TD (refer to FIG. 1). The display device UD may include the display module DM and a cabinet CB. That is, the display module DM may be coupled to the cabinet CB to form one unit display device UD. A position of the display module DM may be adjusted by the display module position adjustment device while the display module DM is being coupled to the cabinet CB.

Referring to FIG. 2, an assembly member FP may be disposed on a rear surface of the display module DM. The assembly member FP may be used to fix the display module DM to the cabinet CB. The assembly member FP may be provided in plural. According to an embodiment, at least two assembly members FP may be provided. Although not shown in the figures, when two assembly members FP are provided, the two assembly members FP may be disposed at edges of the display module DM in a diagonal line to be spaced apart from each other. In FIG. 2, four assembly members FP are shown to be provided. The assembly members FP may be attached to the rear surface of the display module DM to be spaced apart from each other.

In an embodiment, a shield member SH may be further disposed on the rear surface of the display module DM. The shield member SH may be used to protect a circuit board included in the display module DM.

In an embodiment, an opening AA may be defined through the cabinet CB. The opening AA may be provided to expose a portion of the display module position adjustment device described later to the outside. For example, controllers of the display module position adjustment device may be exposed to the outside through the opening AA of the cabinet CB. This will be described in further detail later.

Figure 3:
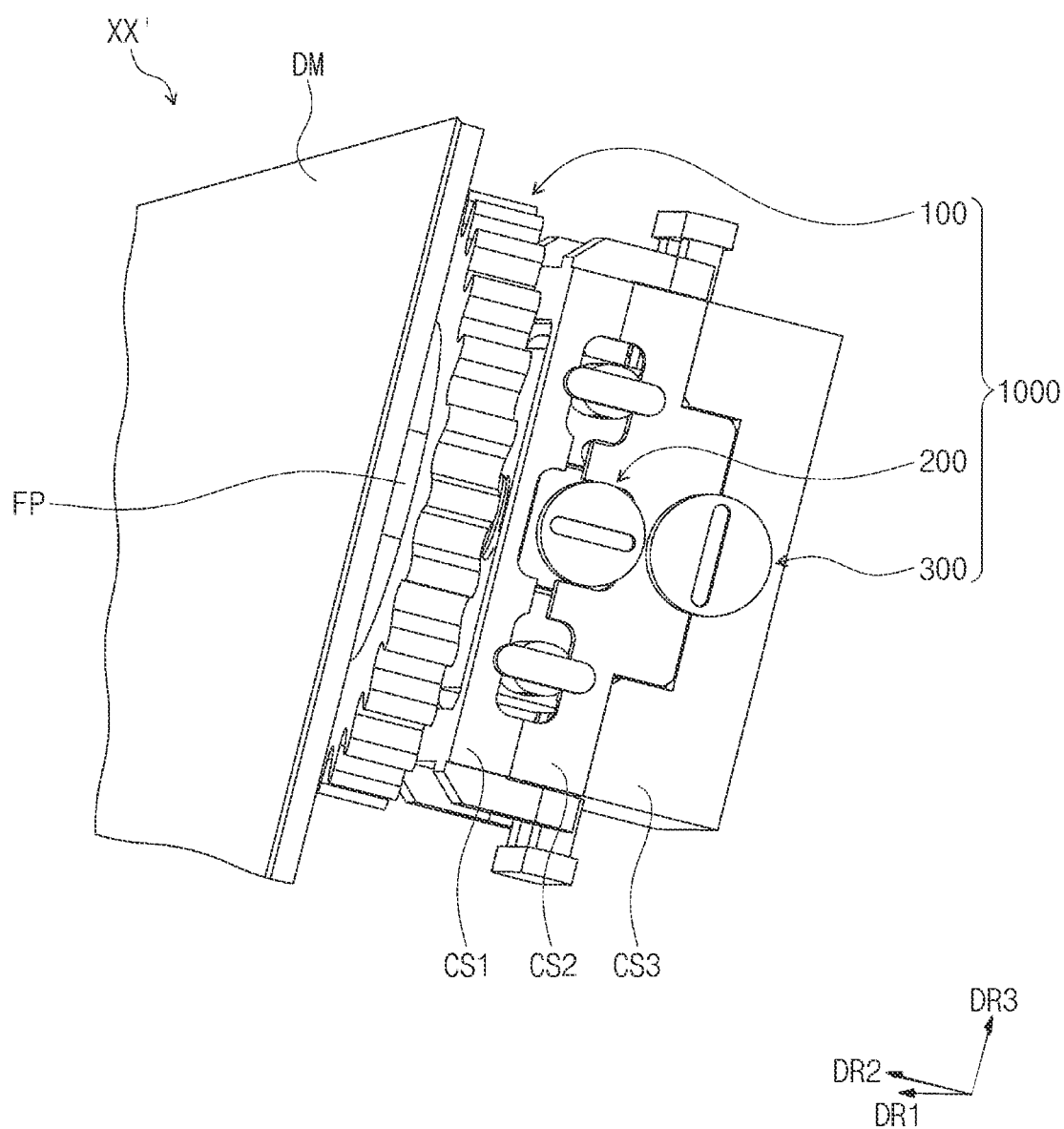
FIG. 3 is a view showing a position adjustment device for a display module, which is coupled to a display device, according to an embodiment of the present disclosure.
Figure 4A:
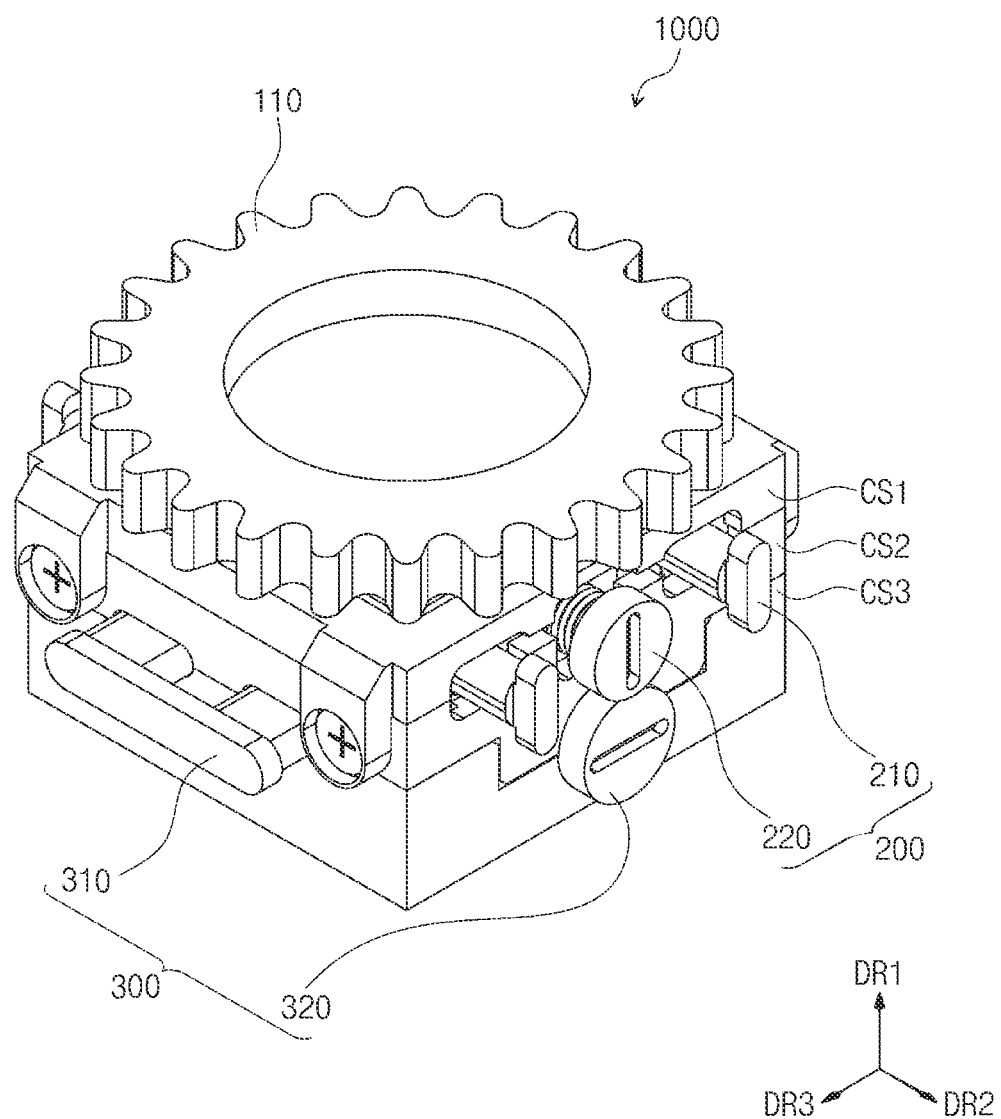
FIGS. 4A and 4B are perspective views showing a position adjustment device for a display module according to an embodiment of the present disclosure.
Figure 4B:
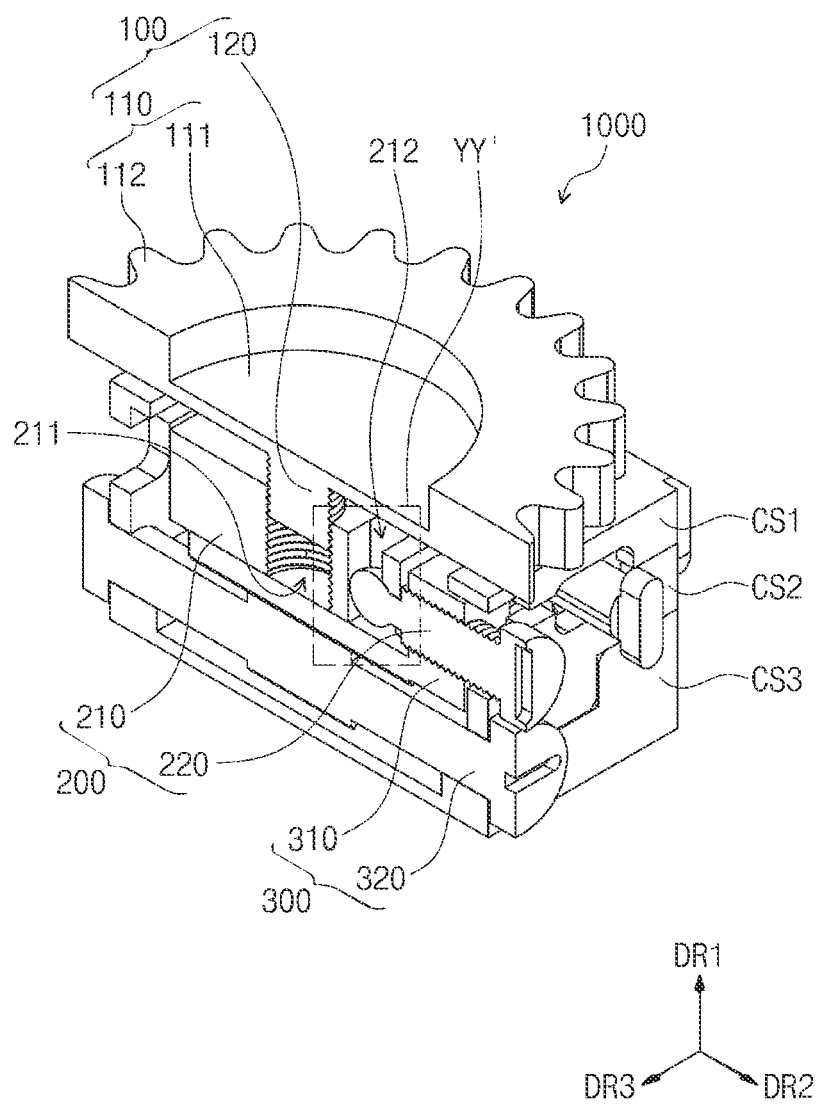

FIG. 3 is a view showing the display module position adjustment device coupled to the display device according to an embodiment of the present disclosure. FIG. 3 is a view showing the display module position adjustment device in a region XX' of FIG. 2. FIGS. 4A and 4B are perspective views showing the display module position adjustment device according to an embodiment of the present disclosure. FIG. 4B is a perspective cross-sectional view taken along a second direction DR2 of FIG. 4A.

Referring to FIG. 3, a display module position adjustment device 1000 may be coupled to the display module DM. In an embodiment, the display module position adjustment device 1000 may be coupled to the assembly member FP disposed on the rear surface of the display module DM. The display module position adjustment device 1000 may be coupled to the assembly member FP of the display module DM to slightly move the display module DM in a first direction DR1, the second direction DR2, and a third direction DR3. In the present embodiment, the first direction DR1 may correspond to a thickness direction of the display module DM, and each of the second direction DR2 and the third direction DR3 may be substantially perpendicular to the first direction DR1. The second direction DR2 and the third direction DR3 may be substantially perpendicular to each other on the same plane. In a coordinate system, the first direction DR1 may correspond to a z-axis direction, the second direction DR2 may correspond to an x-axis direction, and the third direction DR3 may correspond to a y-axis direction.

The display module position adjustment device 1000 may slightly move the display module DM coupled thereto in the first, second, and third directions DR1, DR2, and DR3 and, thus, may adjust the position of the display module DM such that the display module DM is aligned with other display modules adjacent thereto.

Referring to FIGS. 3, 4A, and 4B, the display module position adjustment device 1000 may include a first direction control module 100, a second direction control module 200, and a third direction control module 300.

The first direction control module 100 may control the position of the display module DM in the first direction DR1. That is, the first direction control module 100 may move the display module DM in a direction closer to or away from the cabinet CB (refer to FIG. 2). The second direction control module 200 may control the position of the display module DM in the second direction DR2. For example, the second direction control module 200 may move the display module DM left and right. The third direction control module 300 may control the position of the display module DM in the third direction DR3. For example, the third direction control module 300 may move the display module DM up and down. The display module position adjustment device 1000 may slightly move the display module DM in the first, second, and third directions DR1, DR2, and DR3 to precisely adjust a relative position of the display module DM with respect to other display modules.

Referring to FIGS. 4A and 4B, the first direction control module 100 may include a first stage 110 and a coupling screw 120.

The first stage 110 may be provided with a fixing groove 111 to which the display module DM is fixed. The fixing groove 111 may be defined in an upper surface of the first stage 110. The fixing groove 111 may be defined in a first surface of the first stage 110 facing the display module DM. In further detail, the assembly member FP attached to the display module DM may be fixed to the fixing groove 111.

The coupling screw 120 may protrude from the first stage 110 to a second stage 210. The coupling screw 120 may be disposed on a second surface opposite to the first surface of the first stage 110 in which the fixing groove 111 is defined. The coupling screw 120 may include a plurality of first thread crests. A plurality of first thread crests may be coupled to a plurality of first thread roots of the second stage 210. In the present disclosure, for the convenience of explanation, the thread crest and the thread root are used to be distinguished from each other, but they should not be particularly limited thereto or thereby. For example, it may be expressed that thread roots of the coupling screw 120 are coupled to the thread crests of the second stage 210.

That is, the first stage 110 may be rotatably coupled to the second stage 210 by the coupling screw 120. When the coupling screw 120 is tightened, the first stage 110 may move in the first direction DR1 to be close to the second stage 210. When the coupling screw 120 is loosened, the first stage 110 may move in the first direction DR1 to be away from the second stage 210. That is, a rotational motion of the coupling screw 120 may cause a linear motion in the first direction DR1 of the first stage 110.

In an embodiment, a plurality of concave-convex portions 112 may be provided on a third surface that connects the first surface and the second surface of the first stage 110. The first, second, and third surfaces may respectively correspond to upper, lower, and side surfaces of the first stage 110. The concave-convex portions 112 may correspond to a controller of the first direction control module 100. A user may rotate the first stage 110 by attaching an adjustment tool to the concave-convex portions 112. With the rotation of the first stage 110, the coupling screw 120 is loosened or tightened from the second stage 210, and the first stage 110 may move in the first direction DR1.

The second direction control module 200 may include the second stage 210 and a first controller 220. The second stage 210 may move in the second direction DR2 by the first controller 220. That is, the user may operate the first controller 220 to allow the second stage 210 to move in the second direction DR2 and, thus, may adjust the position of the display module DM coupled thereto in the second direction DR2.

In further detail, the second stage 210 may move in the second direction DR2 by the first controller 220, and, in this case, the first stage 110 coupled to the second stage 210 may also move in the second direction DR2. Accordingly, the display module DM fixed to the first stage 110 may move in the second direction DR2.

The first controller 220 may be rotatably coupled to the second stage 210 and a third stage 310. That is, the first controller 220 may be rotated by an operation of the user while being coupled to the second stage 210 and the third stage 310. The first controller 220 may rotate while moving in the second direction DR2. The first controller 220 may push or pull the second stage 210 coupled thereto in the second direction DR2 while moving in the second direction DR2. That is, the rotational motion of the first controller 220 may cause a linear motion in the second direction DR2 of the second stage 210.

The third direction control module 300 may include the third stage 310 and a second controller 320.

The third stage 310 may move in the third direction DR3. The third stage 310 may be coupled to the first controller 220, and the first controller 220 may be coupled to the second stage 210. That is, the third stage 310 may be coupled to the second stage 210 by the first controller 220.

The second stage 210 may be coupled to the first stage 110. Accordingly, the third stage 310 may be coupled to the first stage 110. The display module DM may be fixed to the first stage 110. When the third stage 310 moves in the third direction DR3, the first stage 110 may also move in the third direction DR3. When the first stage 110 moves in the third direction DR3, the position of the display module DM fixed thereto may move in the third direction DR3. Accordingly, as the third stage 310 moves in the third direction DR3, the position of the display module DM may be adjusted in the third direction DR3.

The second controller 320 may control the third stage 310 such that the third stage 310 moves in the third direction DR3. The second controller 320 may be rotatably coupled to the third stage 310. The second controller 320 may be rotated by an operation of the user. The third stage 310 may move in the third direction DR3 by the rotation of the second controller 320. This will be described in further detail later.

The display module position adjustment device 1000 may further include a first case CS1, a second case CS2, and a third case CS3. The first case CS1, the second case CS2, and the third case CS3 may be coupled to each other to form a case of the display module position adjustment device 1000. The case of the display module position adjustment device 1000 may cover the second stage 210 and the third stage 310 and may expose the first stage 110, the first controller 220, and the second controller 320.

In an embodiment, the first controller 220 of the second direction control module 200 and the second controller 320 of the third direction control module 300 may be disposed along the same direction. For example, the first controller 220 and the second controller 320 may be disposed to be exposed to the second direction DR2. The first controller 220 and the second controller 320 may overlap each other in the first direction DR1 and may extend in the second direction DR2.

In an embodiment, the concave-convex portions 112 on the third surface of the first stage 110 may be exposed to the same direction as the direction to which the first controller 220 and the second controller 320 are exposed. Each of the concave-convex portions 112, the first controller 220, and the second controller 320 may be exposed to the outside via the opening AA (refer to FIG. 2) of the cabinet CB (refer to FIG. 2).

The first case CS1 and the second case CS2 may be coupled to each other to surround the second direction control module 200, and the second case CS2 and the third case CS3 may be coupled to each other to surround the third direction control module 300.

Figure 5A:
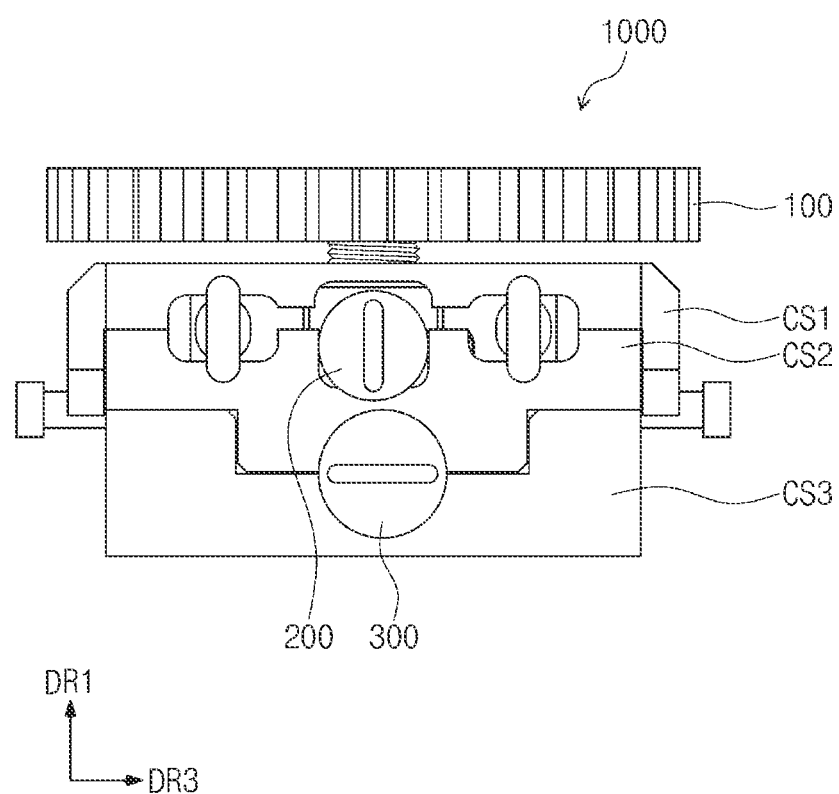
FIGS. 5A and 5B are plan and exploded views, respectively, showing a position adjustment device for a display module according to an embodiment of the present disclosure.
Figure 5B:
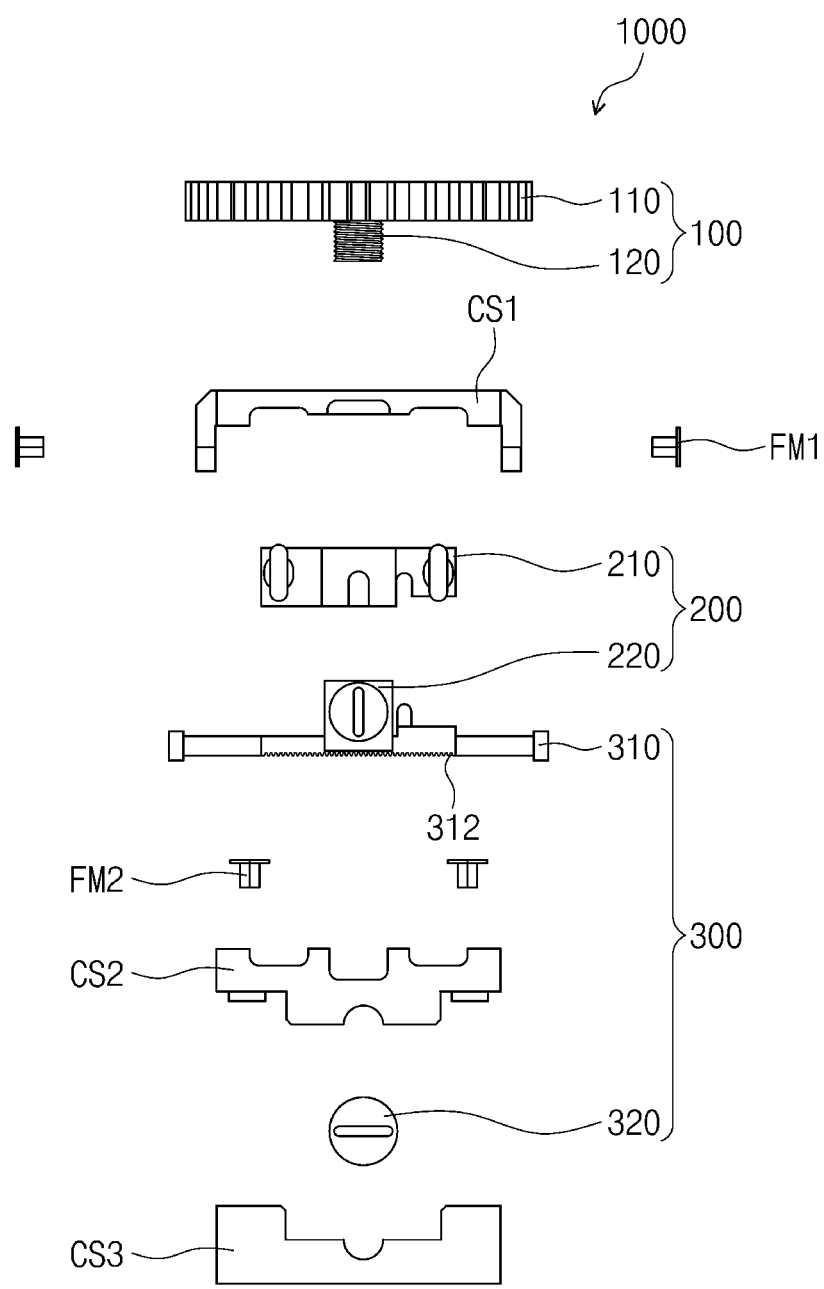
Figure 6A:
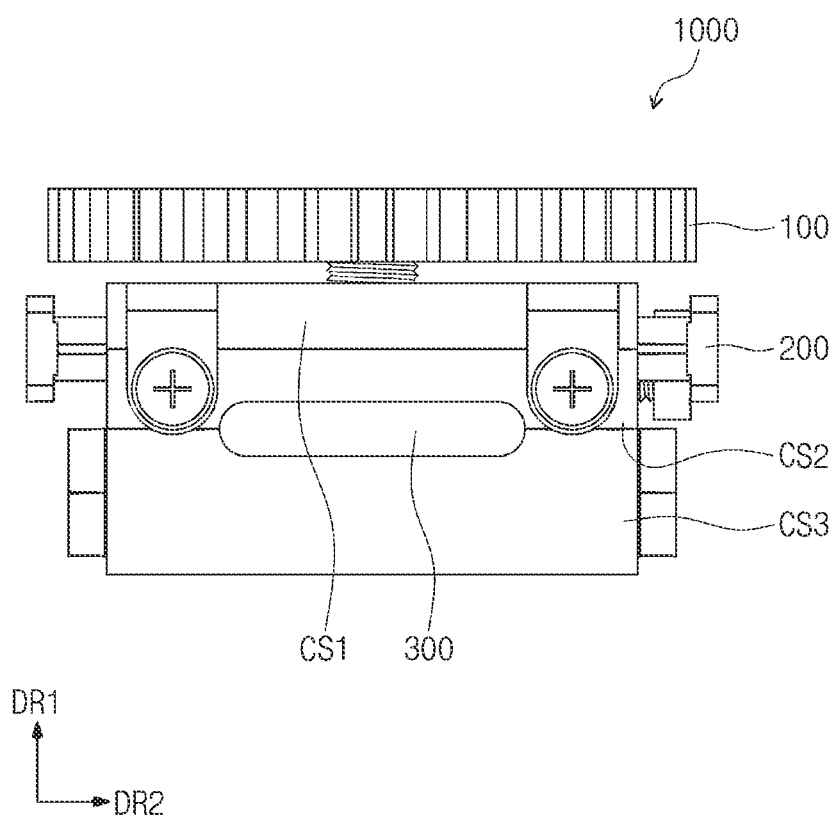
FIGS. 6A and 6B are plan and exploded views, respectively, showing a position adjustment device for a display module according to an embodiment of the present disclosure.
Figure 6B:
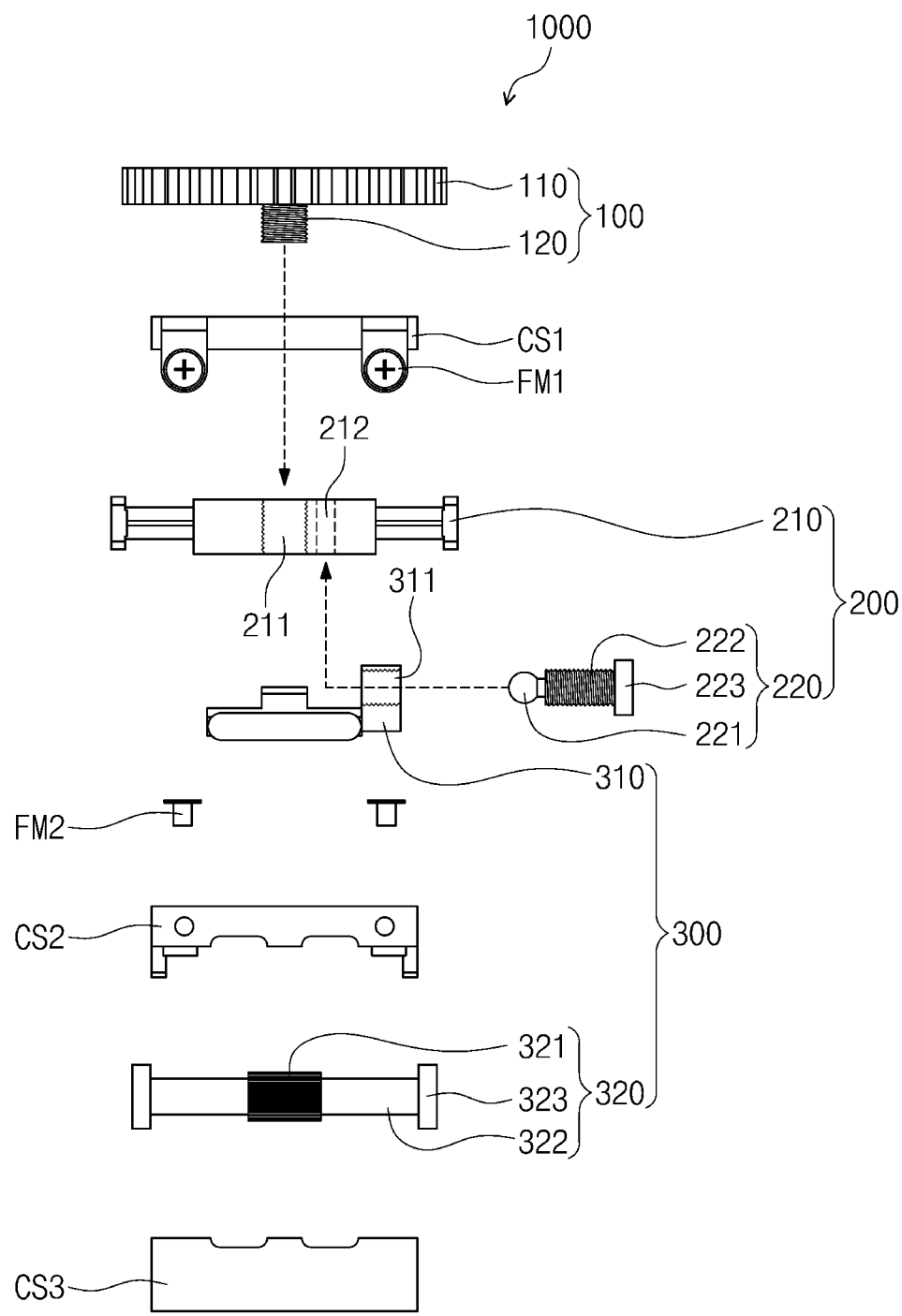

FIGS. 5A and 5B are plan and exploded views, respectively, showing the display module position adjustment device according to an embodiment of the present disclosure. FIGS. 6A and 6B are plan and exploded views, respectively, showing the display module position adjustment device according to an embodiment of the present disclosure. FIGS. 5A and 5B show the display module position adjustment device 1000 according to an embodiment of the present disclosure when viewed in the second direction DR2. FIGS. 6A and 6B show the display module position adjustment device 1000 according to an embodiment of the present disclosure when viewed in the third direction DR3.

Referring to FIGS. 4B, 5A, 5B, 6A, and 6B, the second stage 210 may include a first coupling hole 211 and a second coupling hole 212. The first stage 110 may be coupled to the first coupling hole 211. The first controller 220 may be coupled to the second coupling hole 212.

The first coupling hole 211 may include a plurality of first thread roots. The first thread crests of the coupling screw 120 of the first stage 110 may be coupled to the first thread roots of the first coupling hole 211. As described above, as the coupling screw 120 is tightened or loosened from the first coupling hole 211, the first stage 110 may be precisely moved in the first direction DR1.

Figure 10A:
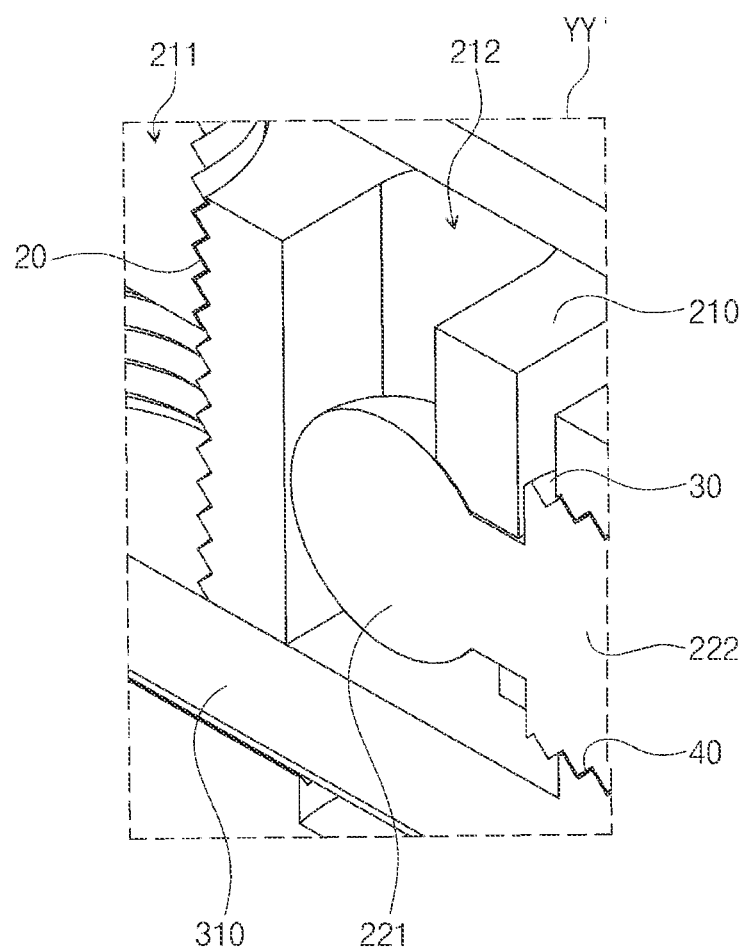
FIG. 10A is an enlarged view showing a region YY' of FIG. 4B.

FIG. 10A is an enlarged view showing a region YY' of FIG. 4B. The first controller 220 is described with reference to FIGS. 6B and 10A. The first controller 220 may include a first portion 221, a second portion 222, and a third portion 223.

The first portion 221 may be coupled to the second coupling hole 212 of the second stage 210. In an embodiment, the first portion 221 may have a spherical shape, and the first portion 221 having the spherical shape may be rotatably coupled to the second coupling hole 212 and may be freely rotated in the second coupling hole 212 having a cylindrical shape.

The second portion 222 may extend from the first portion 221 and may be coupled to a through hole 311 of the third stage 310. The second portion 222 may include a plurality of second thread crests. A plurality of second thread roots may be defined in the through hole 311 of the third stage 310. The second thread crests of the second portion 222 may be coupled to the second thread roots of the through hole 311. Due to the screw coupling, the first controller 220 may move in the second direction DR2 while rotating and may move the second stage 210 coupled thereto in the second direction DR2.

The third portion 223 may correspond to an adjuster of the first controller 220. The third portion 223 may be exposed to the outside of the case. The third portion 223 may be a portion operated by the user. In an embodiment, the third portion 223 may include an adjustment groove 50 (refer to FIG. 7) defined therein. The adjustment groove 50 may be a portion to which an external adjustment tool is attached. The user may insert the adjustment tool into the adjustment groove 50 exposed to the outside and may rotate the first controller 220. Due to the rotation of the first controller 220, the second stage 210 may move in the second direction DR2, and the position of the display module DM (refer to FIG. 3) may be adjusted.

In the exploded views of FIGS. 5B and 6B, the first case CS1 and the second case CS2 may be coupled to each other by a first fastening member FM1. The second direction control module 200 and the third stage 310 may be disposed between the first case CS1 and the second case CS2. The second case CS2 and the third case CS3 may be coupled to each other by a second fastening member FM2. The second controller 320 may be disposed between the second case CS2 and the third case CS3.

In an embodiment, the third stage 310 and the second controller 320 may be in contact with each other with the second case CS2 interposed therebetween. That is, the second case CS2 may expose a first contact portion 312 of the third stage 310 to the second controller 320.

Figure 7:
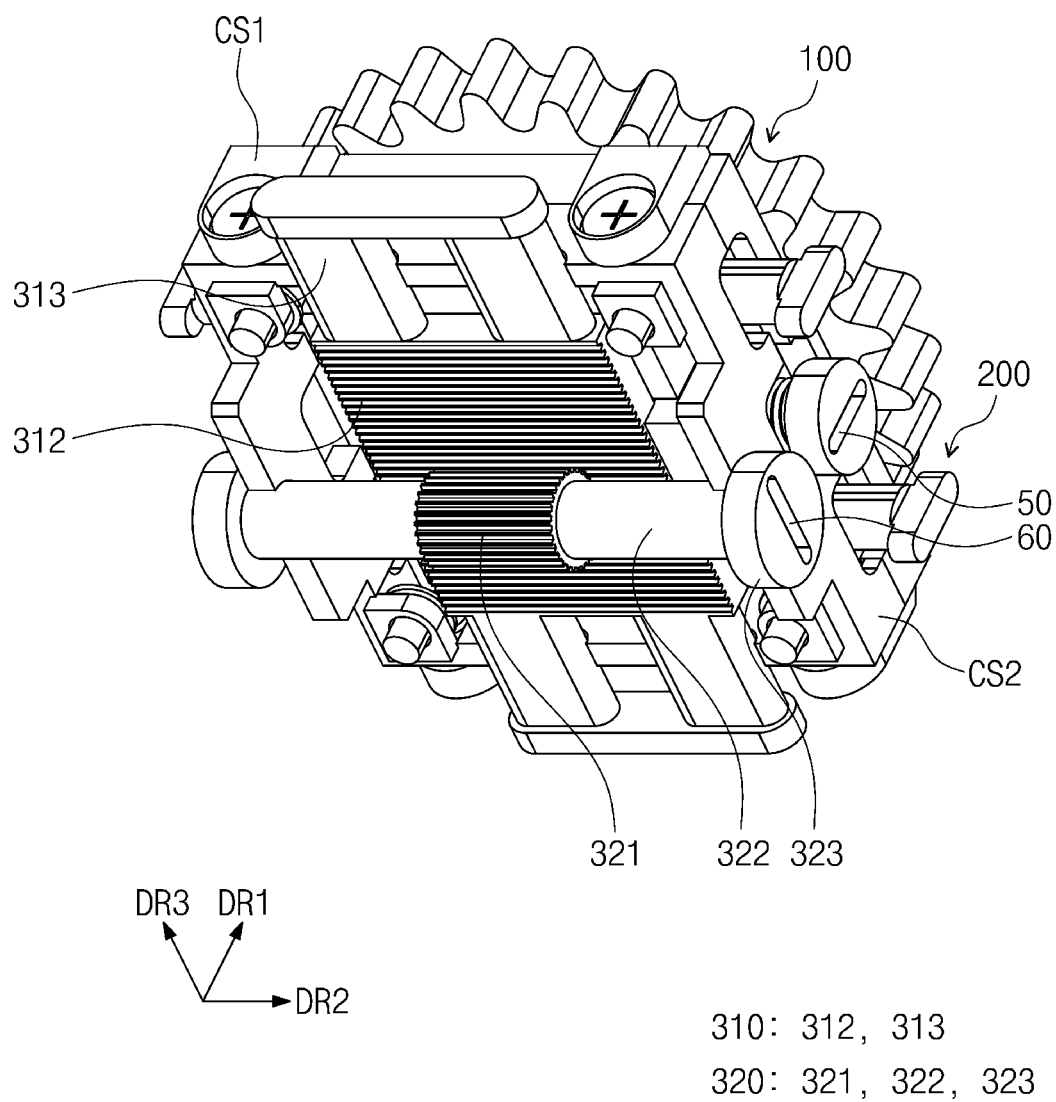
FIG. 7 is a perspective view showing a position adjustment device for a display module according to an embodiment of the present disclosure.

FIG. 7 is a perspective view showing the display module position adjustment device according to an embodiment of the present disclosure. FIG. 7 shows the third direction control module 300 (refer to FIG. 4B). The third direction control module 300 is described with reference to FIG. 7.

Referring to FIG. 7, the third stage 310 may include the first contact portion 312 and a non-contact portion 313. The non-contact portion 313 may not be in contact with the second controller 320 and may be partially exposed to the outside.

The second controller 320 may include a second contact portion 321, a connection portion 322, and a control portion 323. The second contact portion 321 may be in contact with the first contact portion 312. The control portion 323 may be exposed to the outside and may be operated by the user. In an embodiment, the control portion 323 may include an adjustment groove 60. The adjustment groove 60 may be a groove into which the adjustment tool is inserted. At least one control portion 323 may be provided. The connection portion 322 may be disposed between the second contact portion 321 and the control portion 323 and may physically connect the second contact portion 321 and the control portion 323.

In FIG. 7, the first contact portion 312 of the third stage 310 may be in contact with the second contact portion 321 of the second controller 320. The first contact portion 312 may include a plurality of thread roots, and the second contact portion 321 may include a plurality of thread crests. When the first contact portion 312 makes contact with the second contact portion 321, the thread roots may be coupled to the thread crests.

The second controller 320 may be fixed by the second case CS2 and may rotate at its fixed position. The third stage 310 may move in the third direction DR3 due to the rotation of the second controller 320 coupled thereto.

Figure 8:
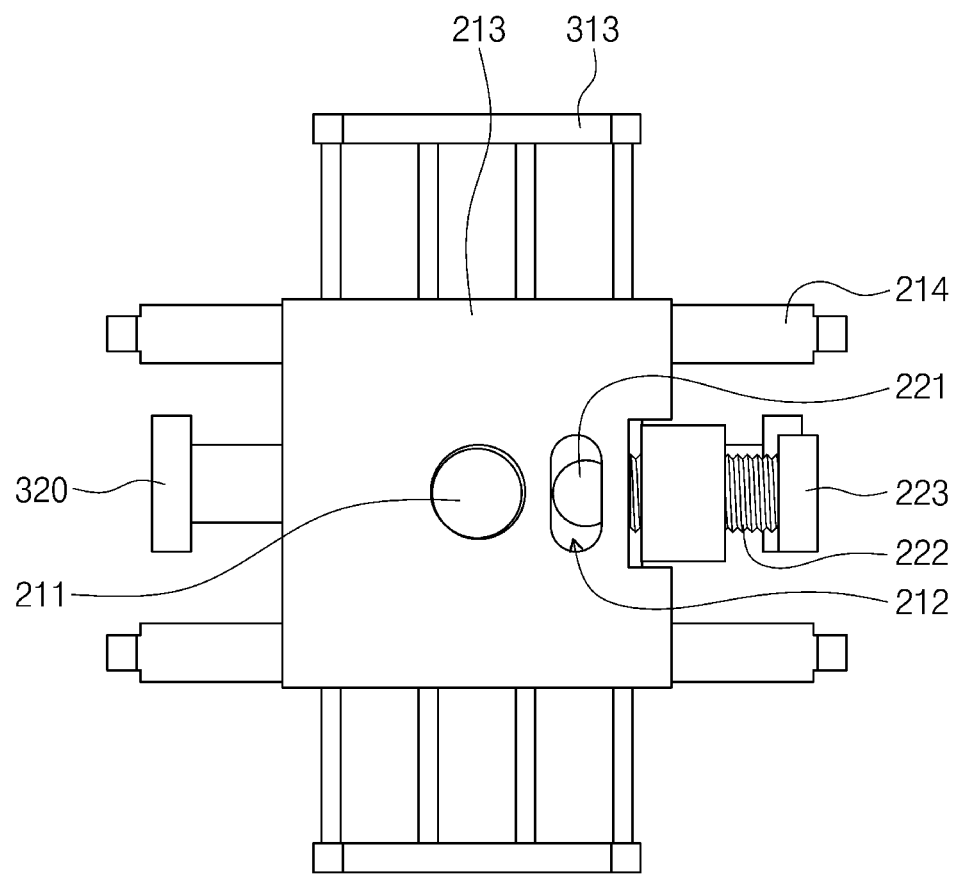
FIG. 8 is a plan view showing a position adjustment device for a display module according to an embodiment of the present disclosure.

FIG. 8 is a plan view showing the display module position adjustment device according to an embodiment of the present disclosure. FIG. 8 shows the second direction control module 200. The second direction control module 200 (refer to FIG. 4B) is described with reference to FIG. 8.

In FIG. 8, the second stage 210 may include a body portion 213 and an arm portion 214. The first coupling hole 211 and the second coupling hole 212 may be defined in the body portion 213. The arm portion 214 may be exposed to the outside of the case. The first controller 220 may be coupled to the third stage 310 (refer to FIG. 6B) and the second coupling hole 212. In further detail, the first portion 221 of the first controller 220 may be coupled to the second coupling hole 212, and the second portion 222 of the first controller 220 may be coupled to the third stage 310. The third portion 223 may be exposed to the outside.

Figure 9:
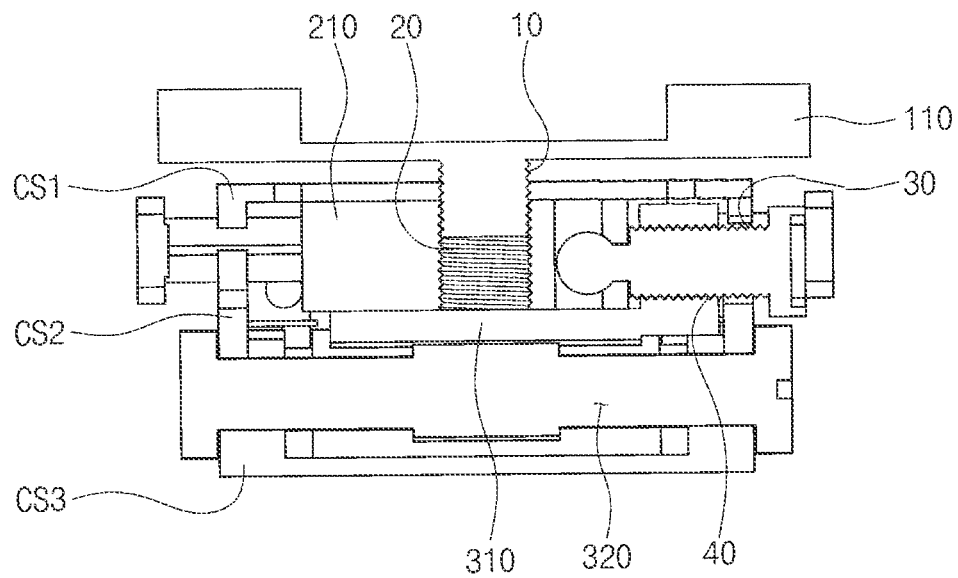
FIG. 9 is a cross-sectional view showing a position adjustment device for a display module according to an embodiment of the present disclosure.
Figure 9:
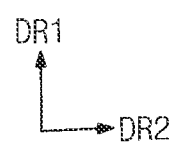

FIG. 9 is a cross-sectional view showing the display module position adjustment device according to an embodiment of the present disclosure.

In FIG. 9, first thread crests 10 of the first direction control module 100 (refer to FIG. 4B) may be coupled to first thread roots 20 of the second stage 210. Second thread crests 30 of the first controller 220 (refer to FIG. 4B) may be coupled to second thread roots 40 of the second stage 210. With reference to FIG. 9, a repetitive description of the same components will be omitted.

Figure 10B:
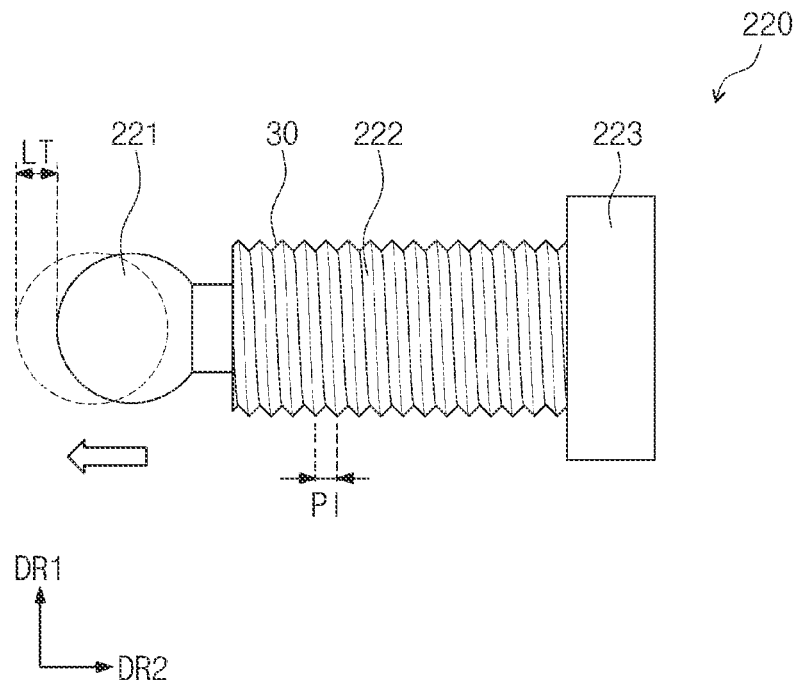
FIGS. 10B and 10C are views showing a first controller according to an embodiment of the present disclosure.
Figure 10C:
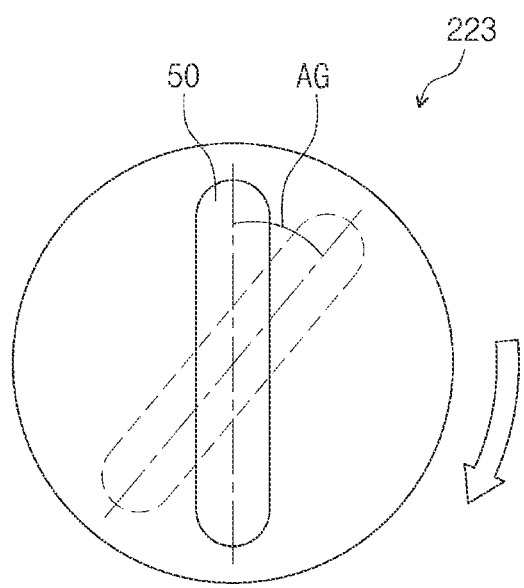

FIGS. 10B and 10C are views showing the first controller 220 according to an embodiment of the present disclosure.

Referring to FIGS. 10B and 10C, in an embodiment, the first controller 220 may include the first portion 221 having the spherical shape, the second portion 222 including the second thread crests 30, and the third portion 223 in which the adjustment groove 50 is defined.

In an embodiment, a moving distance LT of the first controller 220 may be determined based on an interval PI between the second thread crests 30 adjacent to each other and a rotation angle AG of the third portion 223. In an embodiment, the moving distance LT may be obtained by the following equation of $LT=(AG/2\Pi)\times PI$. For example, when the interval PI between the thread crests is "p" and the third portion 223 is rotated by an angle of "a", the first controller 220 may move in the second direction DR2 by "b" (i.e., $b=(a/2\Pi)\times p$). Accordingly, the second stage 210 (refer to FIG. 4B) coupled to the first portion 221 may move in the second direction DR2 by the distance "b" to adjust the position of the display module.

Although some embodiments of the present disclosure have been described, it is to be understood that the present disclosure should not be limited to these example embodiments but, rather, various changes and modifications may be made by one of ordinary skill in the art within the spirit and scope of the present disclosure as herein claimed. Therefore, the disclosed subject matter should not be limited to any single embodiment described herein, and the scope of the present inventive concept shall be determined according to the claims.

What is claimed is:

1. A position adjustment device for a display module, the position adjustment device comprising:
   a first direction control module comprising a first stage to which a display module is fixable, the first stage being movable in a first direction;
   a second direction control module coupled to the first direction control module and comprising a second stage movable in a second direction perpendicular to the first direction, and a first controller coupled to the second stage; and
   a third direction control module coupled to the second direction control module and comprising a third stage movable in a third direction perpendicular to the first direction and crossing the second direction, and a second controller coupled to the third stage,
   wherein the first stage comprises a first surface facing the display module, a second surface opposite to the first surface, and a third surface connecting the first surface and the second surface and comprising a plurality of concave-convex portions defined therein.

2. The position adjustment device of claim 1, wherein the first direction control module further comprises a coupling screw protruding from the first surface of the first stage to the second stage and comprising a plurality of first thread crests.

3. The position adjustment device of claim 2, wherein the second surface comprises a fixing groove to which the display module is fixable.

4. The position adjustment device of claim 2, wherein the second stage comprises a first coupling hole in which a plurality of first thread roots coupled to the first thread crests is defined and a second coupling hole to which the first controller is coupled.

5. The position adjustment device of claim 4, wherein the first controller comprises a first portion coupled to the second coupling hole, a second portion coupled to the third stage, and a third portion exposed to an outside to be operated by a user.

6. The position adjustment device of claim 5, wherein the first portion has a spherical shape.

7. The position adjustment device of claim 5, wherein the second portion comprises a plurality of second thread crests, the third stage comprises a through hole in which a plurality of second thread roots is defined, and the second thread crests are coupled to the second thread roots.

8. The position adjustment device of claim 5, wherein the third portion comprises an adjustment groove to which an adjustment tool to rotate the first controller is engageable.

9. The position adjustment device of claim 2, wherein the coupling screw of the first stage is rotatably coupled to the second stage, and the first stage is rotatable by rotation of the coupling screw to move in the first direction.

10. The position adjustment device of claim 1, wherein the third stage comprises a first contact portion making contact with the second controller and a through hole to which the first controller is coupled.

11. The position adjustment device of claim 10, wherein the second controller comprises a second contact portion making contact with the third stage, a control portion exposed to an outside to be operated by a user, and a connection portion connecting the second contact portion and the control portion.

12. The position adjustment device of claim 11, wherein the control portion comprises an adjustment groove to which an external adjustment tool is engageable.

13. The position adjustment device of claim 11, wherein the first contact portion comprises a plurality of thread roots, and the second contact portion comprises a plurality of thread crests.

14. The position adjustment device of claim 1, wherein the first controller is rotatably coupled to the second stage, and the second stage is movable in the second direction by rotation of the first controller.

15. The position adjustment device of claim 1, wherein the second controller is rotatably coupled to the third stage, and the third stage is movable in the third direction by rotation of the second controller.

16. The position adjustment device of claim 1, wherein the first controller is arranged in a same direction as the second controller.

17. The position adjustment device of claim 1, further comprising:
   a first case between the first direction control module and the second direction control module;
   a second case coupled to the first case and arranged between the second direction control module and the third direction control module; and
   a third case coupled to the second case and arranged under the third direction control module.

18. A position adjustment device for a display module, the position adjustment device comprising:
   a first direction control module comprising a first stage to which a display module is fixable, the first stage being movable in a first direction;
   a second direction control module coupled to the first direction control module and comprising a second stage movable in a second direction perpendicular to the first direction, and a first controller coupled to the second stage; and
   a third direction control module coupled to the second direction control module and comprising a third stage movable in a third direction perpendicular to the first direction and crossing the second direction, and a second controller coupled to the third stage,
   wherein the first stage comprises a second surface opposite to a first surface and comprising a fixing groove to which the display module is fixable,
   wherein the first stage comprises a third surface connecting the first surface and the second surface and comprising a plurality of concave-convex portions defined therein.

19. A display device comprising:
   a display module configured to display an image to a front side;
   a cabinet to which the display module is fixed;
   an assembly member on a rear surface of the display module; and
   a display module position adjustment device coupled to the assembly member and fixed inside the cabinet, the display module position adjustment device comprising:
   a first direction control module coupled to the assembly member and comprising a first stage movable in a first direction;
   a second direction control module coupled to the first direction control module and comprising a second stage movable in a second direction perpendicular to the first direction, and a first controller coupled to the second stage; and a third direction control module coupled to the second direction control module and comprising a third stage movable in a third direction perpendicular to the first direction and crossing the second direction, and a second controller coupled to the third stage, wherein the first stage comprises a first surface facing the display module, a second surface opposite to the first surface, and a third surface connecting the first surface and the second surface and comprising a plurality of concave-convex portions defined therein.

20. The display device of claim 19, wherein the cabinet comprises an opening through which portions of the first and second controllers of the display module position adjustment device are exposed.

\* \* \* \* \*